United States Patent
Moriyama

(10) Patent No.: US 9,989,063 B2
(45) Date of Patent: Jun. 5, 2018

(54) MONITORING DEVICE

(71) Applicant: Shimadzu Corporation, Kyoto (JP)

(72) Inventor: Nobuhiko Moriyama, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days. days.

(21) Appl. No.: 15/335,621

(22) Filed: Oct. 27, 2016

(65) Prior Publication Data

US 2017/0184113 A1    Jun. 29, 2017

(30) Foreign Application Priority Data

Dec. 28, 2015 (JP) .................................. 2015-256202

(51) Int. Cl.

| | |
|---|---|
| G01R 19/00 | (2006.01) |
| F04D 27/00 | (2006.01) |
| F04D 17/16 | (2006.01) |
| F04D 25/06 | (2006.01) |
| F04D 29/058 | (2006.01) |
| G01R 22/10 | (2006.01) |
| F04D 19/04 | (2006.01) |

(52) U.S. Cl.
CPC ......... F04D 27/001 (2013.01); F04D 17/168 (2013.01); F04D 19/042 (2013.01); F04D 25/06 (2013.01); F04D 29/058 (2013.01); G01R 22/10 (2013.01)

(58) Field of Classification Search
None
See application file for complete search history.

(56) References Cited

U.S. PATENT DOCUMENTS

| | | | | |
|---|---|---|---|---|
| 5,961,291 A | * | 10/1999 | Sakagami | ............. F04D 19/048 417/42 |
| 2003/0072656 A1 | * | 4/2003 | Niwatsukino | ........... F04D 5/002 417/354 |
| 2007/0258836 A1 | * | 11/2007 | Hofmann | .............. F04D 19/042 417/423.4 |
| 2010/0077792 A1 | * | 4/2010 | Gurin | ................... C10M 105/72 62/470 |

(Continued)

FOREIGN PATENT DOCUMENTS

| | | |
|---|---|---|
| JP | 2003-172292 A | 6/2003 |
| JP | 2010-031679 A | 2/2010 |
| JP | 2013-253502 A | 12/2013 |

*Primary Examiner* — Patrick Assouad
*Assistant Examiner* — Demetrius Pretlow
(74) *Attorney, Agent, or Firm* — Renner, Otto, Boisselle & Sklar, LLP

(57) ABSTRACT

A monitoring device for monitoring power consumption of a magnetic bearing vacuum pump rotatably driven by a motor and configured such that a rotor is magnetically levitated and supported by a magnetic bearing, comprises: a calculator configured to calculate the power consumption of the magnetic bearing vacuum pump, the power consumption of the magnetic bearing vacuum pump being obtained by adding power consumption of the motor based on a motor rotational speed and a motor current value and power consumption of the magnetic bearing together; and a display controller configured to display, on a display device, the power consumption of the magnetic bearing vacuum pump calculated by the calculator.

6 Claims, 9 Drawing Sheets

(56) References Cited

U.S. PATENT DOCUMENTS

| | | | |
|---|---|---|---|
| 2011/0313238 A1* | 12/2011 | Reichenbach | A61M 1/1086 600/16 |
| 2012/0027583 A1* | 2/2012 | Hofmann | F04D 19/042 415/229 |
| 2013/0224042 A1* | 8/2013 | Ohfuji | F04D 19/042 417/44.1 |
| 2014/0271237 A1* | 9/2014 | Kozaki | F04D 19/042 417/45 |
| 2015/0114101 A1* | 4/2015 | Enomoto | F04D 27/001 73/114.69 |

* cited by examiner

FIG. 3

DATA TABLE DT1

TYPE A

| ITEM | | VARIABLE | | VALUE |
|---|---|---|---|---|
| HEATER SPECIFICATIONS [W] | RATED VOLTAGE | VHT | | 200 |
| | RATED POWER | WHT | | 200 |
| MAGNETIC BEARING POWER CONSUMPTION [W] | | WMB | ORIENTATION | |
| | | | UPRIGHT | 25 |
| | | | LANDSCAPE | 35 |
| DECELERATION | ROTATIONAL SPEED AT 0 W IN DECELERATION [%] | R0 | | 25 |
| | MAXIMUM POWER IN DECELERATION [W] | Pb | | 70 |
| STATE OTHER THAN DECELERATION | MAXIMUM MOTOR POWER [W] | Pmax | | 1000 |
| | MAXIMUM MOTOR CURRENT [W] | Amax | | 9.0 |

TYPE B

| ITEM | | VARIABLE | | VALUE |
|---|---|---|---|---|
| HEATER SPECIFICATIONS [W] | RATED VOLTAGE | VHT | | 200 |
| | RATED POWER | WHT | | 300 |
| MAGNETIC BEARING POWER CONSUMPTION [W] | | WMB | ORIENTATION | |
| | | | UPRIGHT | 35 |
| | | | LANDSCAPE | 45 |
| DECELERATION | ROTATIONAL SPEED AT 0 W IN DECELERATION [%] | R0 | | 25 |
| | MAXIMUM POWER IN DECELERATION [W] | Pb | | 90 |
| STATE OTHER THAN DECELERATION | MAXIMUM MOTOR POWER [W] | Pmax | | 1200 |
| | MAXIMUM MOTOR CURRENT [W] | Amax | | 11.5 |

FIG. 4

DATA TABLE DT2

| PUMP No. | VHT | WHT | WMB | R0 | Pb | Pmax | Amax | η |
|---|---|---|---|---|---|---|---|---|
| TMP1 | 200 | 200 | 25 | 25 | 70 | 1000 | 9.0 | |
| TMP2 | 200 | 300 | 35 | 25 | 90 | 1200 | 11.5 | |
| TMP3 | 200 | 300 | 45 | 25 | 90 | 1200 | 11.5 | |

FIG. 7

POWER CONSUMPTION W(i) DATABASE

| No t | TMP 1 | TMP 2 | TMP 3 | TMP 4 | ... |
|---|---|---|---|---|---|
| t1 | 325 | 185 | 475 | 300 | |
| t2 | 325 | 185 | 475 | 300 | |
| t3 | 325 | 185 | 475 | 300 | |
| t4 | 125 | 185 | 475 | 300 | |
| t5 | 125 | 485 | 475 | 300 | |
| t6 | 125 | 485 | 475 | 300 | |

MONITORING DEVICE

BACKGROUND OF THE INVENTION

1. Technical Field

The present invention relates to a monitoring device.

2. Background Art

Patent Literature 1 describes a turbo-molecular pump including a power consumption calculator configured to calculate the power consumption of a turbo-molecular pump. In Patent Literature 1 (JP-A-2010-31679), motor power consumption corresponding to a motor current and a pump rotational speed is calculated, and is taken as the pump power consumption.

However, in the case of a magnetic bearing turbo-molecular pump, magnetic bearing power consumption is also included in pump power consumption. For this reason, in conventional power consumption calculation, the pump power consumption cannot be calculated with a high accuracy. Moreover, since plural turbo-molecular pumps are typically used for a semiconductor manufacturing device, it is not sufficient to separately calculate the power consumption of each turbo-molecular pump.

SUMMARY OF THE INVENTION

A monitoring device for monitoring power consumption of a magnetic bearing vacuum pump rotatably driven by a motor and configured such that a rotor is magnetically levitated and supported by a magnetic bearing, comprises: a calculator configured to calculate the power consumption of the magnetic bearing vacuum pump, the power consumption of the magnetic bearing vacuum pump being obtained by adding power consumption of the motor based on a motor rotational speed and a motor current value and power consumption of the magnetic bearing together; and a display controller configured to display, on a display device, the power consumption of the magnetic bearing vacuum pump calculated by the calculator.

The magnetic bearing vacuum pump further includes a heater, and the calculator calculates heater power consumption based on an on/off state of the heater, and adds the heater power consumption, the power consumption of the motor, and the power consumption of the magnetic bearing together to calculate the power consumption of the magnetic bearing vacuum pump.

The monitoring device further comprises: a communicator to which the motor current value and the motor rotational speed are input from the magnetic bearing vacuum pump via communication with the magnetic bearing vacuum pump. The calculator calculates the power consumption of the motor based on the motor current value and the motor rotational speed input by the communicator.

The monitoring device further comprises: a storage configured to store a power consumption property of the magnetic bearing vacuum pump, the magnetic bearing vacuum pump including plural different types of magnetic bearing vacuum pumps. The calculator calculates the power consumption of each magnetic bearing vacuum pump based on the power consumption property associated with a magnetic bearing vacuum pump type targeted for calculation.

The calculator specifies the power consumption of the magnetic bearing according to pump mounting orientation.

A storage medium storing a program for causing a computer to operate the monitoring device is provided. The computer executes a step of calculating power consumption of the motor based on a motor rotational speed and a motor current value, a step of specifying power consumption of the magnetic bearing, a step of calculating power consumption of the magnetic bearing vacuum pump, the power consumption of the magnetic bearing vacuum pump being obtained by adding the power consumption of the motor and the power consumption of the magnetic bearing together, and a step of displaying the calculated power consumption of the magnetic bearing vacuum pump on a display device.

A monitoring device for monitoring power consumption of a plurality of vacuum pumps, comprises: a calculator configured to calculate power consumption of the plurality of vacuum pumps; a total power consumption calculator configured to calculate a total of the power consumption of the plurality of vacuum pumps calculated by the calculator; and a display controller configured to display the total of the power consumption of the plurality of vacuum pumps on a display device.

According to the present invention, vacuum pump power consumption can be monitored with a higher accuracy.

BRIEF DESCRIPTION OF THE DRAWINGS

FIG. 3 shows an example of a data table DT1;

FIG. 4 shows an example of a data table DT2;

FIG. 7 is a table of an example of a database on a power consumption W(i) ;

DETAILED DESCRIPTION OF THE EXEMPLARY EMBODIMENTS

Hereinafter, embodiments of the present invention will be described with reference to the drawings.

First Embodiment

Figure 1:
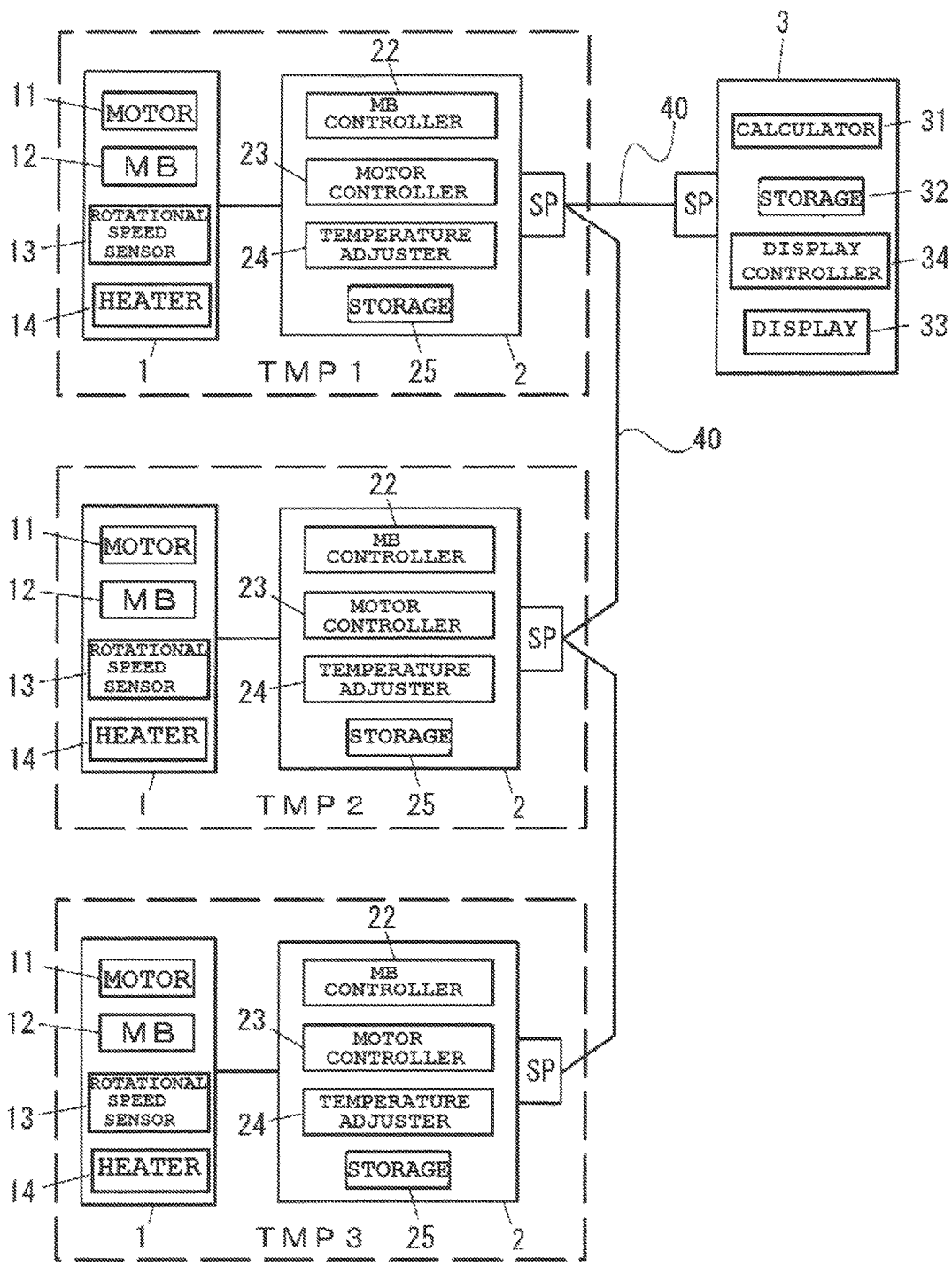
FIG. 1 is a diagram of an example of a pump system including a monitoring device of the present invention.

FIG. 1 is a diagram of an example of a pump system including a monitoring device of the present invention. In the pump system, plural turbo-molecular pumps TMP1, TMP2, TMP3 are provided. Note that three turbo-molecular pumps are provided in the example illustrated in FIG. 1, but the number of turbo-molecular pumps may be equal to or less than two, or may be equal to or greater than four. The power consumption etc. of the turbo-molecular pumps TMP1 to TMP3 are monitored by a monitoring device 3.

Each of the turbo-molecular pumps TMP1 to TMP3 includes a pump unit 1 configured to perform vacuum pumping, and a control unit 2 configured to control driving of the pump unit 1. The pump unit 1 and the control unit 2 may be separated from each other, or may be integrated with each other. Moreover, the turbo-molecular pumps TMP1 to TMP3 may be the same type of pump, or may be different types of pumps.

Figure 2:
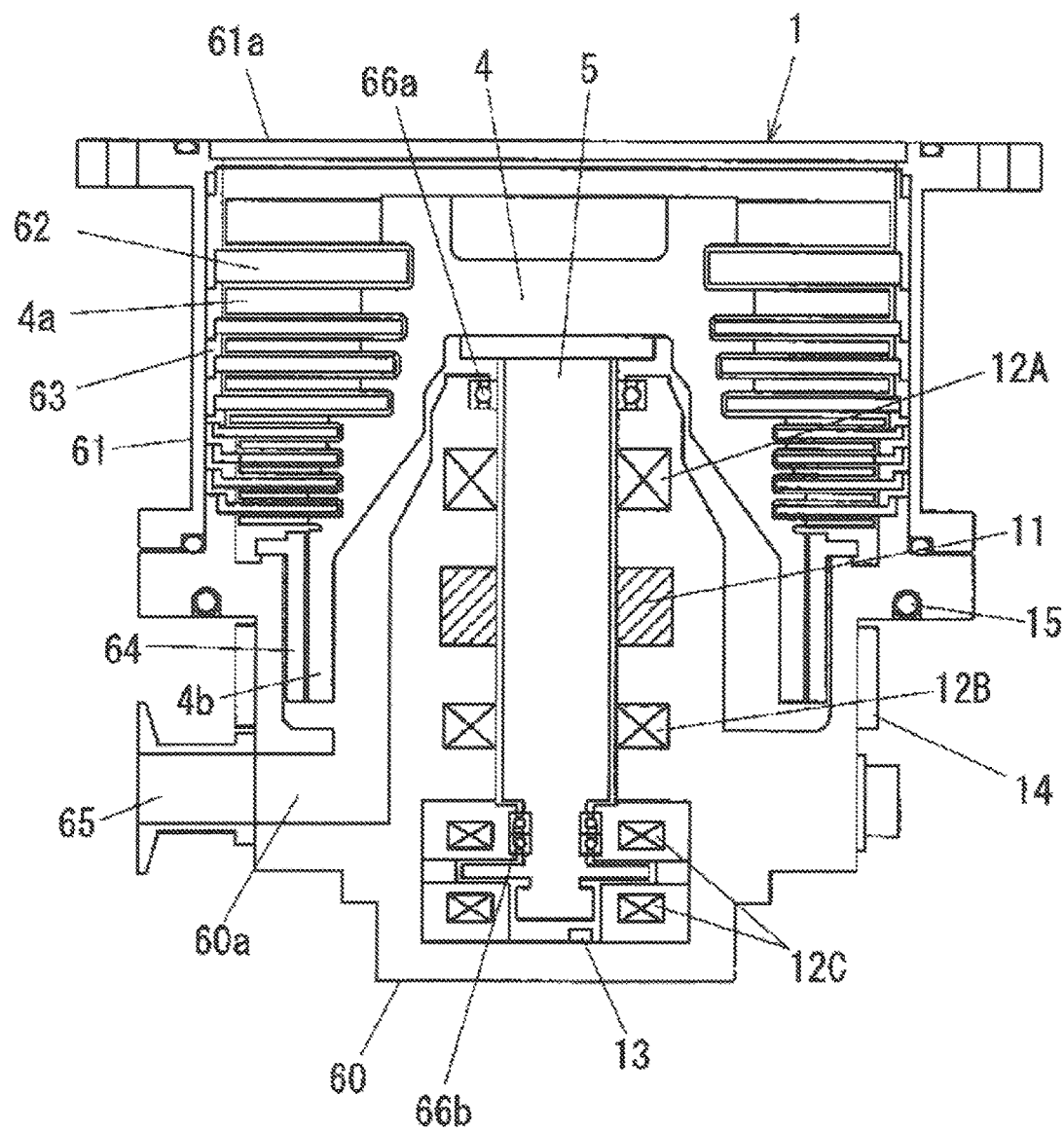
FIG. 2 is a cross-sectional view of the details of a pump unit 1.

FIG. 2 is a cross-sectional view of the details of the pump unit 1. The turbo-molecular pumps TMP1 to TMP3 of the present embodiment are magnetic bearing turbo-molecular pumps. A rotor shaft 5 to which a pump rotor 4 is fixed is, in a non-contact state, supported by radial magnetic bearings 12A, 12B and an axial magnetic bearing 12C, the bearings 12A, 12B, 12C being provided at a base 60. Each of the magnetic bearings 12A to 12C includes electromagnets and a displacement sensor, and the displacement sensor is configured to detect the levitation position of the rotor shaft 5.

The rotor shaft 5 is rotatably driven by a motor 11. The motor 11 is a synchronous motor, and in the present embodiment, a DC brushless motor is used as the motor 11. The rotational speed of the rotor shaft 5 is detected by a rotational speed sensor 13. When the magnetic bearings 12A to 12C are not in operation, the rotor shaft 5 is supported by emergency mechanical bearings 66a, 66b.

Plural rotor blades 4a are formed on an upstream side at the pump rotor 4, and a cylindrical portion 4b forming a screw groove pump is formed on a downstream side at the pump rotor 4. Plural stationary blade stators 62 and a screw stator 64 are, on a fixed side, provided corresponding to the rotor blades 4a and the cylindrical portion 4b. Although a screw groove is formed at the screw stator 64 side in the example illustrated in FIG. 2, the screw groove may be formed at the cylindrical portion 4b. Each stationary blade stator 62 is placed above the base 60 with a spacer ring 63 being interposed between the stationary blade stator 62 and the base 60.

A pump casing 61 provided with a suction port 61a is fixed to the base 60 with bolts. An exhaust port 65 is provided at an exhaust port 60a of the base 60, and a back pump is connected to the exhaust port 65. When the rotor shaft 5 coupled to the pump rotor 4 is rotated at high speed by the motor 11, gaseous molecules are exhausted from the suction port 61a toward the exhaust port 65.

A heater 14 and a refrigerant pipe 15 through which refrigerant such as coolant flows are provided at the base 60. In the case of exhausting gas which tends to cause reaction product deposition, temperature adjustment is, in order to reduce product deposition on the screw groove pump and the rotor blades 4a on the downstream side, performed by on/off of the heater 14 and on/off of a refrigerant flow through the refrigerant pipe 15 such that abase temperature in the vicinity of a screw stator fixed portion reaches a predetermined temperature, for example. Note that although not shown in the figure, a solenoid valve for on/off of the refrigerant flow is provided at the refrigerant pipe 15.

Returning to FIG. 1, the control unit 2 includes an MB controller 22 configured to control driving of the magnetic bearing 12 (12A, 12B, 12C), a motor controller 23 configured to control driving of the motor 11, a temperature adjuster 24 configured to perform on/off control of the heater 14 and the refrigerant flow, and a storage 25 configured to store pump type information etc. Moreover, the control unit 2 further includes a serial communication port SP for serial communication among the control unit 2 and other devices.

The monitoring device 3 of the present embodiment is the device configured to monitor a pump state including the power consumption of the turbo-molecular pumps TMP1 to TMP3. The monitoring device 3 is formed of, e.g., a computer. The monitoring device 3 includes a storage 32 configured to store a power consumption calculation program, a calculator 31 configured to execute the power consumption calculation program to perform power consumption calculation processing, a display 33, a display controller 34, and a serial communication port SP. Each control unit 2 of the turbo-molecular pumps TMP1 to TMP3 is connected to the monitoring device 3 via a serial communication line 40. The monitoring device 3 calculates, as described later, the power consumption based on the pump state information and the pump type information transmitted from each control unit 2 and a data table (hereinafter referred to as a "data table DT1") on the power consumption properties of each pump type stored in the storage 32.

The pump state information transmitted from each control unit 2 contains a motor current value from the motor controller 23, motor operation state information and rotational speed information based on the output signal of the rotational speed sensor 13. Moreover, the pump state information further contains temperature adjustment operation information from the temperature adjuster 24. As described above, temperature adjustment is performed in such a manner that on/off of the heater 14 and on/off of the solenoid valve configured to control the refrigerant flow are controlled. Power is supplied from the control unit 2 to the heater 14 and the solenoid valve, and the power consumption thereof (the power consumption required for temperature adjustment) forms part of the power consumption of the turbo-molecular pump.

For the sake of simplicity in description below, only heater power consumption is regarded as the power consumption required for temperature adjustment. For this reason, only heater on/off information is taken as the temperature adjustment operation information. In the case where the power consumption required for temperature adjustment includes the power consumption of the solenoid valve, the power consumption may be, as in the case of the heater power consumption, calculated according to the on/off state of the solenoid valve.

FIG. 3 shows an example of the data table DT1 on the power consumption properties of each pump type. A data table for a type A is shown on the upper side, and a data table for a type B is shown on the lower side. Items include heater specifications (a rated voltage VHT, a rated power WHT), a magnetic bearing power consumption WMB, a maximum power Pb and a specific rotational speed (the ratio with respect to a rated rotational speed) R0 at a power of 0 [W] in motor deceleration, a maximum motor power Pmax and a maximum motor current Amax in a state other than motor deceleration, and a loss η in, e.g., a circuit. Each item will be described in detail later in association with power consumption calculation.

The calculator 31 is configured to generate a data table (hereinafter referred to as a "data table DT2") on each connected turbo-molecular pump TMPi based on the pump type information (the information on the type A or B) read from each control unit 2 and the data table DT1 shown in FIG. 3 to store the generated data table in the storage 32. FIG. 4 shows an example of the data table DT2. The data table DT2 collectively shows the power consumption properties of each turbo-molecular pump. In FIG. 3, the seven types of power consumption properties (VHT, WHT, WMB, R0, Pb, Pmax, Amax) are shown as items.

Suppose that in the example illustrated in FIG. 1, the turbo-molecular pump TMP1 is the type A, and the mounting orientation of the pump unit 1 is upright orientation; on the other hand, the turbo-molecular pumps TMP2, TMP3 are the type B, the mounting orientation of the turbo-molecular pump TMP2 is upright orientation, and the mounting orientation of the turbo-molecular pump TMP3 is landscape orientation. The mounting orientation is input to the monitoring device 3 by a user. The calculator 31 of the monitoring device 3 reads, based on the mounting orientation input by the user, the value of the magnetic bearing power consumption WBH from the data table DT1 to input such a value to the data table DT2. The power consumption properties (VHT, WHT, R0, Pb, Pmax, Amax, η) other than the magnetic bearing power consumption WBH in the data table DT2 are automatically generated by the calculator 31 based on the type information read from the turbo-molecular pump TMPi.

Note that in the present embodiment, the configuration is employed, in which the type information is stored in the storage 25 of the control unit 2 and is read by the monitoring device 3 via serial communication. Instead, the type information may be input to the monitoring device 3 by the user.

Moreover, in the above-described embodiment, the configuration is employed, in which the mounting orientation of the pump unit 1 is manually input to the monitoring device 3 by the user. However, the monitoring device 3 may automatically estimate the mounting orientation based on magnetic bearing current. For example, in each of the radial magnetic bearings 12A, 12B, the electromagnets are arranged to sandwich the rotor shaft 5. In the upright orientation, the pair of facing electromagnets has the substantially same current value. On the other hand, in the case of the pump unit 1 in the landscape orientation, the current value of one of the electromagnets is greater than that of the other electromagnet. For this reason, the difference in current between the electromagnets can be monitored to estimate whether the mounting orientation is the upright or landscape orientation.

For orientation determination, a signal with an electromagnetic current value may be read from the control unit 2 to the monitoring device 3 to determine the mounting orientation on the monitoring device side, or the orientation may be determined in the control unit 2 to input the determination result to the monitoring device 3.

<Power Consumption Calculation>

Next, the power consumption calculation method executed in the calculator 31 of the monitoring device 3 will be described. The program on the power consumption is stored in the storage 32 of the monitoring device 3, and the calculator 31 reads such a program from the storage 32 to execute the program.

A power consumption W(i) in each of the magnetic bearing turbo-molecular pumps TMP1 to TMP3 is simply calculated according to Expression (1). A reference character "i" denotes any of the turbo-molecular pumps TMP1 to TMP3, "i=1" indicates the turbo-molecular pump TMP1, "i=2" indicates the turbo-molecular pump TMP2, and "i=3" indicates the turbo-molecular pump TMP3.

$$W(i)=Wh(i)+\{WMB(i)+Wm(i)\}/\eta \quad (1)$$

In Expression (1), "Wm(i)" denotes the power consumption of the motor 11, "WMB(i)" denotes the power consumption of the magnetic bearing 12, and "Wh(i)" denotes the power consumption of the heater 14. Moreover, "η" denotes a loss in, e.g., a power supply circuit or an internal wiring, and the loss η varies according to the type of the control unit 2. Note that the combination of the pump unit 1 and the control unit 2 is determined according to the pump type, but the same control unit 2 may be used for plural types of pump unit 1. The loss η is obtained by comparison between the power consumption W(i) calculated using Expression (1) and an actual value of the power consumption W(i), and is stored in the storage 25 of the control unit 2. Note that calculation of the power consumption W(1), W(2), W(3) of the turbo-molecular pumps TMP1 to TMP3 is performed in a similar manner, and therefore, the reference character "i" will be described as a representative example.

[Calculation of Heater Power Consumption Wh(i)]

Although there are various types of specifications of the heater 14 used for temperature adjustment, a heater with an AC of 200V is used, and 200 [W] specifications or 300 [W] specifications are used according to the pump type. Moreover, an AC input voltage Vin [V] for the turbo-molecular pump TMPi depends on a power supply voltage in user's usage, and therefore, the user sets the AC input voltage Vin in advance. In the present embodiment, description is made supposing that the AC input voltage Vin is, in advance, input to the storage 32 of the monitoring device 3 by the user. In addition, the AC input voltage Vin is common to all of the turbo-molecular pumps TMPi.

The calculator 31 reads, via serial communication, the heater on/off information from the temperature adjuster 24. When the specifications of the heater 14 are a rated voltage VHT [V] and a rated power WHT(i) [W], a heater power consumption Wh(i) is represented by Expressions (2), (3) according to the heater on/off information.

$$\text{(Heater On State): } Wh(i)=Vin^2/\{VHT^2/WHT(i)\} \quad (2)$$

$$\text{(Heater Off State): } Wh(i)=0 \quad (3)$$

[Calculation of Magnetic Bearing Power Consumption WMB(i)]

The power consumption WMB(i) [W] of the magnetic bearing 12 is simply regarded as being constant regardless of an operation state when the mounting orientation of the pump unit 1 is a fixed state. As shown in the data table DT1 of FIG. 3, the power consumption of the magnetic bearing 12 varies according to the pump type and the mounting orientation. The mounting orientation of the pump unit 1 is determined according to a vacuum device to which the pump unit 1 is attached. Once the pump unit 1 is attached, the mounting orientation of the pump unit 1 does not change.

The typical mounting orientation of the turbo-molecular pump TMPi includes the "upright orientation" and the "landscape orientation," and the correspondence between the mounting orientation for each type and the power consumption is stored in the data table DT1. In the present embodiment, the mounting orientation of each turbo-molecular pump TMPi is input to the monitoring device 3 by the user. The calculator 31 stores the value of the magnetic bearing power consumption WMB in the data table DT2 based on the input mounting orientation and the data table DT1.

When the user requests the magnetic bearing power consumption data on the turbo-molecular pump TMPi, the calculator 31 reads the value of the magnetic bearing power consumption WMB(i) of the turbo-molecular pump TMPi from the data table DT2 to provide such data to the user. For example, the display controller 34 displays the value of the magnetic bearing power consumption WMB(i) on the display 33.

[Calculation of Motor Power Consumption Wm(i)]

The power consumption Wm(i) of the motor 11 varies according to the operation state of the motor 11. The turbo-molecular pump TMPi in the present embodiment generates motor regenerative power during motor deceleration. Such regenerative power is used for a power supply of the control unit 2, and is used as magnetic bearing power, for example. Thus, in the state in which the regenerative power is generated, a primary-side power consumption is zero, except for a heater output. For this reason, the formula for calculating the motor power consumption is different between the case of performing a deceleration operation and the case of not performing the deceleration operation. Note that in regenerative power generation, an AC input is used for a power supply of the heater 14.

(Case of not Performing Deceleration Operation)

In the case of not performing the deceleration operation, the power consumption of the motor 11 can be calculated using a motor rotational speed and a motor current value. In the present embodiment, the motor power consumption Wm(i) in the case of not performing the deceleration operation is calculated using Expression (4).

$$Wm(i)=(Rs \times MC \times Pmax)/(Amax \times 100) \quad (4)$$

In Expression (4), "Rs" [%] denotes a motor rotational speed based on a detection value of the rotational speed sensor 13, and "MC" [A] denotes a motor current value output from the motor controller 23. In addition, "Pmax" [W] denotes a maximum motor power, and "Amax" denotes a maximum motor current. As shown in FIG. 3, values for each pump type are stored in the data table DT1.

(Case of Performing Deceleration Operation)

In the deceleration operation, the primary-side power consumption is, within a range of equal to or greater than the specific rotational speed R0 [%], zero due to generation of the motor regenerative power, except for the heater output. In this case, "R0" is a % value when the rated rotational speed is 100%. When the motor rotational speed falls below the specific rotational speed R0, the primary-side power consumption tends to increase with a decrease in the rotational speed. The motor power consumption Wm(i) in this state can be calculated using Expression (5).

$$(Rs \geq R0): Wm(i)=0$$

$$(Rs<R0): Wm(i)=Pb \times (R0-Rs)/R0 \quad (5)$$

The calculator 31 reads, via serial communication, a motor current value MC, a motor rotational speed Rs, and motor operation information from the motor controller 23 of the control unit 2. The motor operation information indicates the information on whether or not the deceleration operation is performed, and is based on an operation command input to the motor controller 23, for example. Based on the motor operation information, the calculator 31 determines whether or not the deceleration operation is performed.

When it is determined that the deceleration operation is performed, the calculator 31 determines whether or not the read motor rotational speed Rs is equal to or greater than the specific rotational speed R0. In the case of determining as Rs≥Ro, the calculator 31 calculates the motor power consumption Wm(i) as Wm(i)=0. On the other hand, in the case of determining as Rs<R0, the calculator 31 calculates the motor power consumption Wm(i), using the maximum power Pb in deceleration in the data table DT2, the specific rotational speed R0 in the data table DT2, the motor rotational speed Rs read from the control unit 2, and Expression (5).

When it is determined that the deceleration operation is not performed, the calculator 31 calculates the motor power consumption Wm(i), using the maximum motor power Pmax in the data table DT2, the maximum motor current Amax in the data table DT2, the motor rotational speed Rs read from the control unit 2, motor current value MC read from the control unit 2 and Expression (4).

Subsequently, the calculator 31 calculates the total power consumption W(i) of each turbo-molecular pump TMPi, using the above-described calculated heater power consumption Wh(i), the above-described calculated magnetic bearing power consumption WMB(i), the above-described calculated motor power consumption Wm(i), the loss η in the data table DT2, and Expression (1). By adding the power consumptions W(i) together, the calculator 31 calculates the total power consumption Wall of the turbo-molecular pumps TMPi connected to the monitoring device 3.

Figure 5:
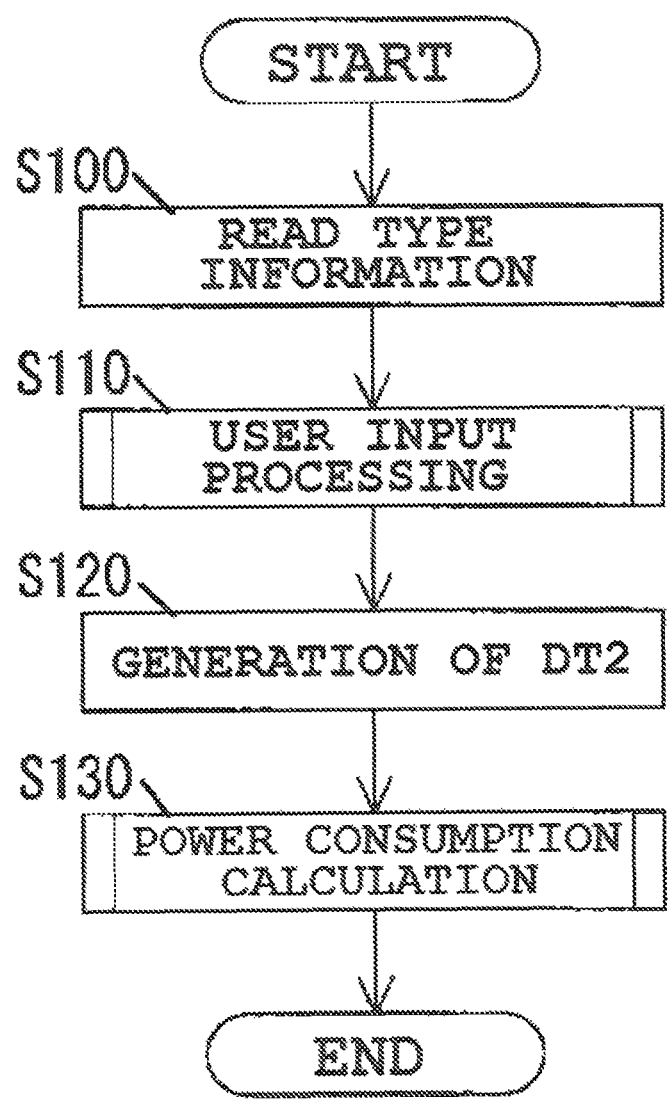
FIG. 5 is a flowchart of example processing steps of power consumption calculation.
Figure 6:
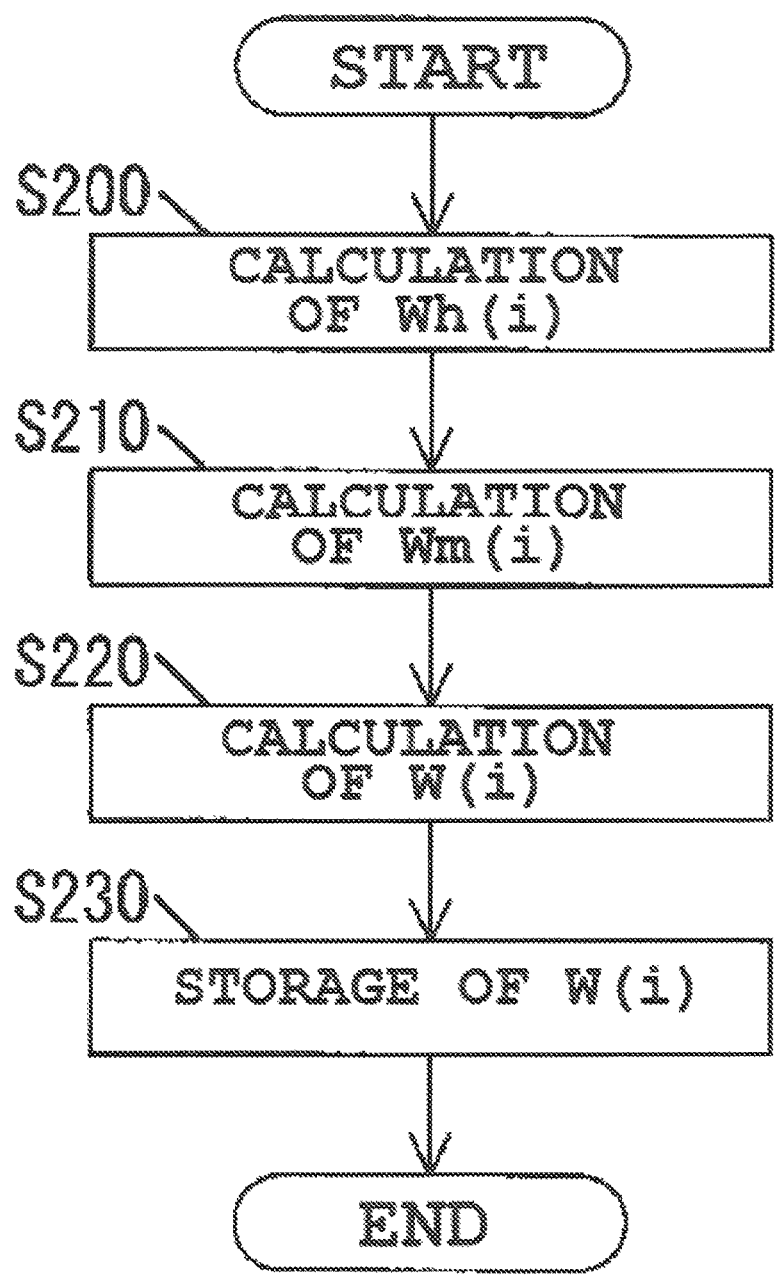
FIG. 6 is a flowchart of an example of power consumption calculation processing at step s130.

FIGS. 5 and 6 are flowcharts of example processing steps of power consumption calculation. When user operation generates a command of starting power consumption monitoring processing by the monitoring device 3, the calculator 31 executes the processing shown in FIG. 5. At step S100, the pump type information is read from each control unit 2 via the serial communication line 40. At step S110, the user inputs the AC input voltage Vin and the pump orientation. For example, an input setting screen is displayed on the display 33 of the monitoring device 3. The user inputs, according to a command via the input setting screen, the AC input voltage Vin and each turbo-molecular pump TMPi.

At step S120, the data table DT2 is generated based on the type information read at step S100, the AC input voltage Vin and the pump orientation input at step S110, and the data table DT1 stored in the storage 32. At step S130, the power consumption calculation processing shown in FIG. 6 is executed.

FIG. 6 is the flowchart of the example of the power consumption calculation processing of step S130. The power consumption calculation processing of FIG. 6 is repeated at predetermined time intervals, for example. Note that when the data table DT2 is generated at step S120 of FIG. 5, calculation of the magnetic bearing power consumption WMB(i) is already completed by the processing of extracting the magnetic bearing power consumption WMB(i) associated with the type and orientation of each turbo-molecular pump TMPi from the data table DT1. For this reason, in the power consumption calculation processing shown in FIG. 6, calculation is made for the heater power consumption Wh(i), the motor power consumption Wm(i), and the total power consumption W(i) of the turbo-molecular pump TMPi.

At step S200 of FIG. 6, calculation of the heater power consumption Wh(i) is, using Expressions (2), (3), made for each turbo-molecular pump TMPi according to the heater on/off information read from the temperature adjuster 24, as described above. At step S210, the motor power consumption Wm(i) associated with the executed state or the non-executed state of the deceleration operation is calculated for each turbo-molecular pump TMPi, as described above.

At step S220, the total power consumption W(i) of each turbo-molecular pump TMPi is calculated using Expression (1). At step S230, the calculated power consumption W(i) of each turbo-molecular pump TMPi is stored in the storage 32. Note that each of the calculated motor power consumption Wm(i), the calculated heater power consumption Wh(i), and the calculated power consumption W(i) may be stored in the storage 32. As described above, the processing from step S200 to step S230 is repeated at the predetermined time intervals, and the power consumption W(i) is stored in the storage 32 at every processing. For example, the power consumption W(i) is stored as in the database shown in FIG. 7. In FIG. 7, "t1," "t2," . . . each denote date and time of calculation of the power consumption W(i).

Figure 8:
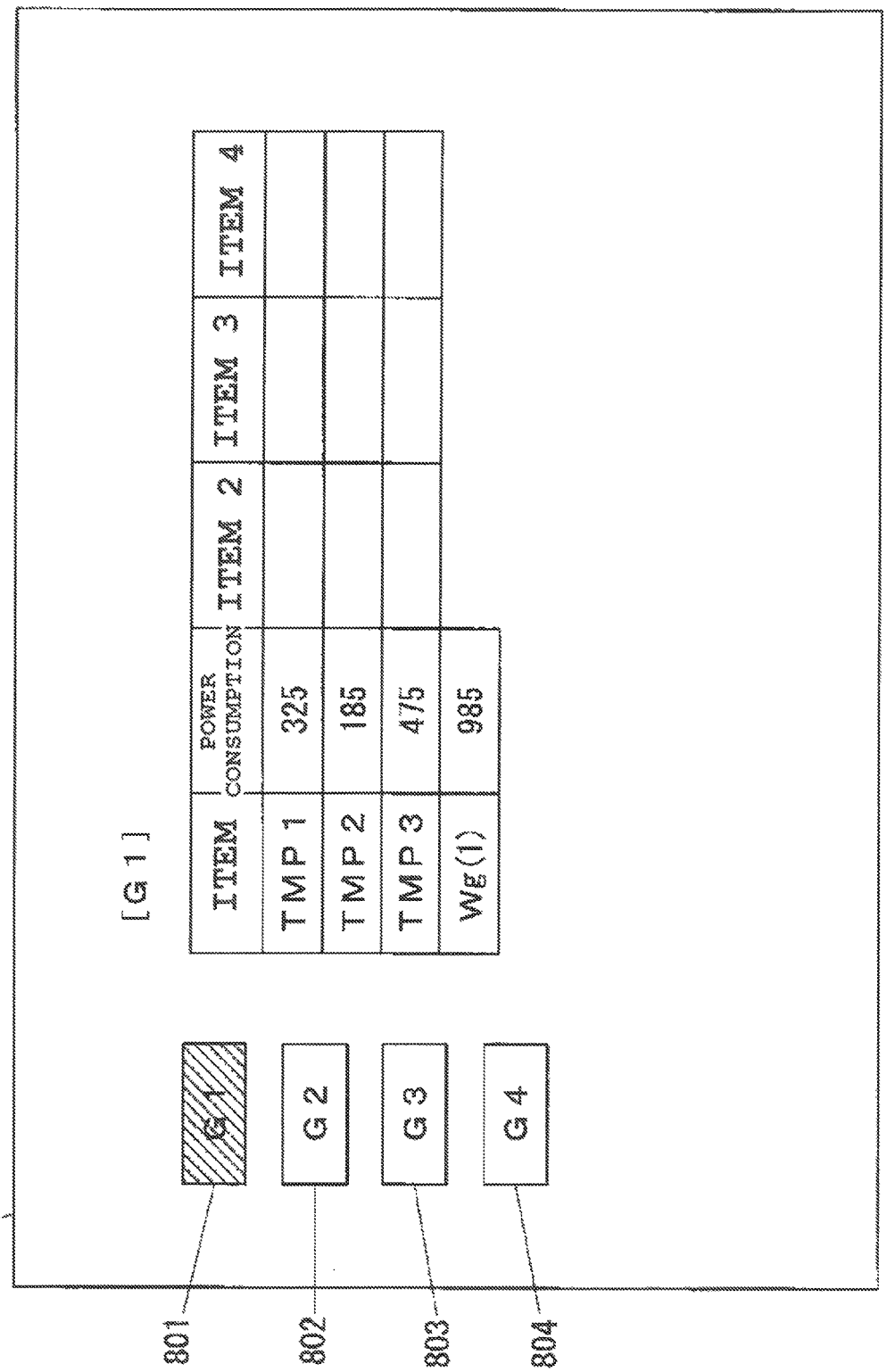
FIG. 8 is a view of a screen example of power consumption.

FIG. 8 is a view of a screen example of the power consumption on the display 33. The plurality of turbo-molecular pumps TMPi is collectively managed as a plurality of pump groups. In the screen example of FIG. 8, various types of data (first to fourth items) of each turbo-molecular pump are displayed for each pump group. The power consumption W(i) is displayed as one of these types of data. In addition, when the screen of FIG. 8 is displayed, the total power consumption Wg(k) of the pump group is calculated in the calculator 31, and the power consumption Wg(k) and the power consumptions W(i) are displayed together.

The display 33 is a touch panel display, and regions 801 to 804 indicated respectively by "G1" to "G4" indicating the pump groups are touch switches. When the region 801 indicated by "G1" is touched, the data on the turbo-molecular pumps TMP1 to TMP3 included in the pump group G1 is displayed as shown in FIG. 8. Moreover, when the region 802 indicated by "G2" is touched, the data on the turbo-molecular pump(s) TMPi included in the pump group G2 is displayed.

Note that the turbo-molecular pumps TMP typically include the above-described turbo-molecular pump with the heater 14, and a turbo-molecular pump without the heater 14. Needless to say, the above-described processing on the heater power consumption Wh(i) is skipped for the turbo-molecular pump TMP without the heater 14.

Second Embodiment

In the above-described first embodiment, the monitoring device 3 connected to the turbo-molecular pumps TMPi and configured to monitor the power consumption of these turbo-molecular pumps TMPi has been described. In a second embodiment, a monitoring device is provided at a control unit 2 of a turbo-molecular pump TMP, and the power consumption of such a turbo-molecular pump TMP is output from the control unit 2 as a monitoring result.

Figure 9:
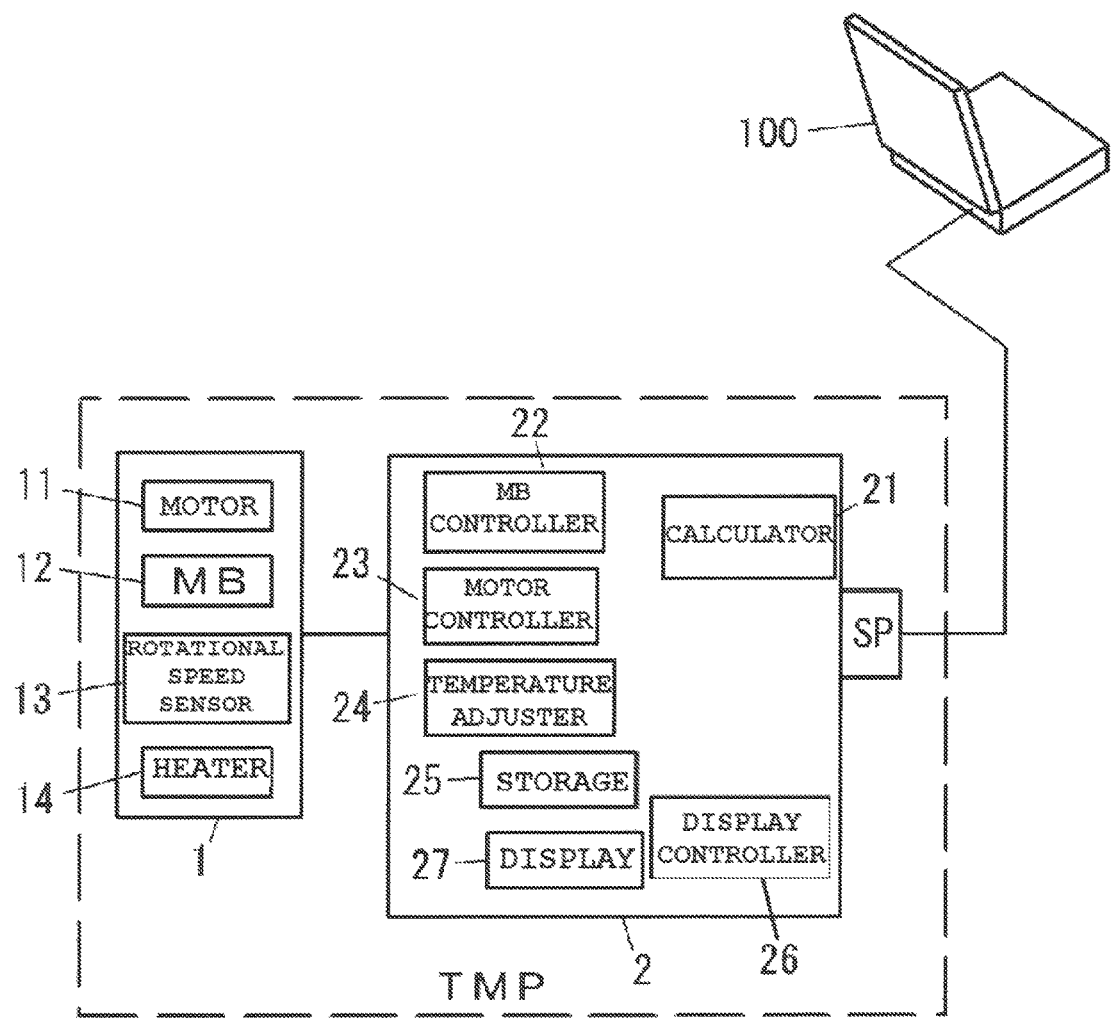
FIG. 9 is a block diagram for describing a monitoring device of a second embodiment.

FIG. 9 is a block diagram for describing the monitoring device of the second embodiment. In the present embodiment, power consumption calculation is performed in a calculator 21 provided at the control unit 2 of the turbo-molecular pump TMP. A power consumption calculation program, a data table DT1, a loss, orientation information, and information on an AC input voltage Vin are stored in a storage 25. Note that the data table DT1 shown on the upper side in FIG. 3 is stored when the type of the turbo-molecular pump TMP is a type A, and the data table DT1 shown on the lower side in FIG. 3 is stored when the type of the turbo-molecular pump TMP is a type B. Moreover, the orientation information and the information on the AC input voltage Vin are input to the storage 25 by a user.

Although description will not be repeated, a heater power consumption Wh, a magnetic bearing power consumption WMB, a motor power consumption Wm, and a total pump power consumption W are, in the calculator 21, calculated in a similar manner to that of the first embodiment. The calculated power consumptions Wh, WMB, Wm, W is stored in the storage 25 of the control unit 2. Other configuration of the turbo-molecular pump TMP is similar to that of the turbo-molecular pump TMPi (see FIG. 1) described in the first embodiment, and description thereof will not be repeated.

The power consumption Wh, WMB, Wm, W stored in the storage 25 can be output from a serial communication port SP. For example, the power consumption Wh, WMB, Wm, W may be output from the serial communication port SP to a computer 100, and may be displayed on a display (not shown) of the computer 100 by the data management software or the display software installed in the computer 100. Alternatively, the power consumption Wh, WMB, Wm, W may be displayed on a display 27 by a display controller 26 of the control unit 2 of the turbo-molecular pump TMP.

Note that in FIG. 9, only a single turbo-molecular pump TMP is connected to the computer 100, but plural turbo-molecular pumps TMPi may be connected to the computer 100.

As described above, in the second embodiment, the calculator 21, the storage 25, and the serial communication port SP in the control unit 2 function as a monitoring device configured to monitor power consumption in the turbo-molecular pump TMP. The calculator 21 is configured to calculate the power consumption Wm of a motor 11 based on a motor rotational speed and a motor current value, the power consumption WMB of a magnetic bearing 12 associated with pump mounting orientation, and the power consumption W of the magnetic bearing turbo-molecular pump TMP obtained by adding the power consumption Wm of the motor 11 and the power consumption WMB of the magnetic bearing 12 together. The serial communication port SP functions as an output configured to output the power consumption W to the outside.

According to the above-described embodiments, the following features and advantageous effects can be provided.

(1) In the calculator of the monitoring device, i.e., the calculator 31 of FIG. 1 or the calculator 21 of FIG. 9, the power consumption of the magnetic bearing turbo-molecular pump TMP obtained by adding the power consumption of the motor 11, which is based on the motor rotational speed and the motor current value, and the power consumption of the magnetic bearing 12 together is calculated. Then, the calculated power consumption of the turbo-molecular pump TMP is displayed on the display 27, 33 by the display controller 26, 34. As described above, the motor power consumption and the magnetic bearing power consumption are added together to obtain the power consumption of the turbo-molecular pump TMP, and therefore, the power consumption of the turbo-molecular pump TMP can be monitored with a higher accuracy.

Moreover, the magnetic bearing power consumption is specified according to the pump mounting orientation, and therefore, the accuracy in power consumption calculation can be further improved.

(2) In the case of the turbo-molecular pump including the heater, the calculator 21, 32 calculates the heater power consumption based on the on/off state of the heater 14, and then, adds the heater power consumption, the power consumption of the motor 11, and the power consumption of the magnetic bearing 12 together to calculate the power consumption of the turbo-molecular pump TMP. As a result, the total power consumption of the turbo-molecular pump TMP taking the heater power consumption into consideration can be obtained with a high accuracy.

(3) The serial communication port SP of the monitoring device 3 functions as a communicator to which the motor current value and the motor rotational speed are input from each turbo-molecular pump TMPi via communication with each turbo-molecular pump TMPi. The motor current value and the motor rotational speed may be obtained from the turbo-molecular pumps TMPi via the serial communication port SP, and the power consumption of the motor 11 may be calculated based on the obtained motor current value and the obtained motor rotational speed. With such a communicator, the power consumption of the turbo-molecular pumps TMPi can be monitored by the distant monitoring device 3. Further, the power consumption of the turbo-molecular pumps TMPi is calculated in the monitoring device 3, and therefore, the power consumption of the turbo-molecular pumps TMPi can be collectively monitored.

(4) The power consumption properties of the plural different types of turbo-molecular pumps TMPi may be stored in the storage 32, and the calculator 31 may calculate the power consumption of each turbo-molecular pump TMPi based on the power consumption properties associated with the turbo-molecular pump type targeted for calculation. As a result, even in the case where the plural different types of turbo-molecular pumps TMPi are connected to the monitoring device 3 via the serial communication ports SP, the power consumption associated with each turbo-molecular pump type is automatically calculated.

(5) As in the turbo-molecular pump TMP illustrated in FIG. 9, the power consumption W of the turbo-molecular pump TMP may be calculated in the calculator 21 of the control unit 2, and then, may be output to the outside via the serial communication port SP. With the configuration in which the power consumption W is output from the turbo-molecular pump TMP, the power consumption of the turbo-molecular pump TMP can be easily managed.

Various embodiments and variations have been described above, but the present invention is not limited to the contents of these embodiments and variations. Other aspects conceivable within the technical idea of the present invention are included in the scope of the present invention. For example, the example of the magnetic bearing turbo-molecular pump has been described in the above-described embodiments. However, the present invention is not limited to the magnetic bearing turbo-molecular pump, and is applicable not only to mechanical bearing turbo-molecular pumps but also to typical vacuum pumps.

What is claimed is:

1. A monitoring device for monitoring power consumption of a magnetic bearing vacuum pump rotatably driven by a motor and configured such that a rotor is magnetically levitated and supported by a magnetic bearing, comprising:
    a calculator configured to calculate the power consumption of the magnetic bearing vacuum pump, the power consumption of the magnetic bearing vacuum pump being obtained by adding power consumption of the motor based on a motor rotational speed and a motor current value and power consumption of the magnetic bearing together; and
    a display controller configured to display, on a display device, the power consumption of the magnetic bearing vacuum pump calculated by the calculator.

2. The monitoring device according to claim 1, wherein the magnetic bearing vacuum pump further includes a heater, and
    the calculator calculates heater power consumption based on an on/off state of the heater, and adds the heater power consumption, the power consumption of the motor, and the power consumption of the magnetic bearing together to calculate the power consumption of the magnetic bearing vacuum pump.

3. The monitoring device according to claim 1, further comprising:
    a communicator to which the motor current value and the motor rotational speed are input from the magnetic bearing vacuum pump via communication with the magnetic bearing vacuum pump,
    wherein the calculator calculates the power consumption of the motor based on the motor current value and the motor rotational speed input by the communicator.

4. The monitoring device according to claim 3, further comprising:
    a storage configured to store a power consumption property of the magnetic bearing vacuum pump, the magnetic bearing vacuum pump including plural different types of magnetic bearing vacuum pumps,
    wherein the calculator calculates the power consumption of each magnetic bearing vacuum pump based on the power consumption property associated with a magnetic bearing vacuum pump type targeted for calculation.

5. The monitoring device according to claim 1, wherein the calculator specifies the power consumption of the magnetic bearing according to pump mounting orientation.

6. A non-transitory computer readable storage medium storing a program for causing a computer to operate the monitoring device according to claim 1, wherein the computer executes
    a step of calculating power consumption of the motor based on a motor rotational speed and a motor current value,
    a step of specifying power consumption of the magnetic bearing,
    a step of calculating power consumption of the magnetic bearing vacuum pump, the power consumption of the magnetic bearing vacuum pump being obtained by adding the power consumption of the motor and the power consumption of the magnetic bearing together, and
    a step of displaying the calculated power consumption of the magnetic bearing vacuum pump on a display device.

* * * * *